(12) United States Patent
Ootsuki et al.

(10) Patent No.: US 8,004,323 B2
(45) Date of Patent: Aug. 23, 2011

(54) PLL CONTROL CIRCUIT

(75) Inventors: Michihito Ootsuki, Tokyo (JP);
Masazumi Sukekawa, Saitama (JP);
Mitsutaka Iwasaki, Tokyo (JP);
Toshihiro Tsukagoshi, Tokyo (JP)

(73) Assignees: NEC Corporation, Tokyo (JP); Ricoh Company, Ltd, Tokyo (JP)

( * ) Notice: Subject to any disclaimer, the term of this patent is extended or adjusted under 35 U.S.C. 154(b) by 294 days.

(21) Appl. No.: 12/092,227

(22) PCT Filed: Nov. 1, 2006

(86) PCT No.: PCT/JP2006/322312
§ 371 (c)(1),
(2), (4) Date: Feb. 2, 2009

(87) PCT Pub. No.: WO2007/052820
PCT Pub. Date: May 10, 2007

(65) Prior Publication Data
US 2009/0267661 A1   Oct. 29, 2009

(30) Foreign Application Priority Data

Nov. 1, 2005   (JP) .................................. 2005-318169

(51) Int. Cl.
*H03L 7/06* (2006.01)
(52) U.S. Cl. ........ 327/156; 327/147; 327/157; 327/158; 327/161; 375/371; 375/372; 375/373; 375/374; 375/375; 331/17

(58) Field of Classification Search .................. 327/156, 327/158, 161; 375/371; 331/17
See application file for complete search history.

(56) References Cited

U.S. PATENT DOCUMENTS

| | | | |
|---|---|---|---|
| 6,037,814 A | | 3/2000 | Hirakawa |
| 7,495,517 B1 * | | 2/2009 | Hoang et al. .................. 331/16 |

FOREIGN PATENT DOCUMENTS

| | | |
|---|---|---|
| JP | 60112324 | 6/1985 |
| JP | 04-282917 A | 10/1992 |
| JP | 5243992 | 9/1993 |
| JP | 5304468 | 11/1993 |
| JP | 1041812 | 2/1998 |
| JP | 200068828 | 3/2000 |
| JP | 2003133951 | 5/2003 |
| JP | 2003152535 | 5/2003 |
| WO | 9919987 | 4/1999 |

* cited by examiner

*Primary Examiner* — Lincoln Donovan
*Assistant Examiner* — John W Poos
(74) *Attorney, Agent, or Firm* — Sughrue Mion, PLLC

(57) ABSTRACT

A PLL control circuit, which outputs a PLL clock in response to a reference clock, is provided with a frequency adjustment circuit which performs frequency adjustment such that the PLL clock frequency is substantially constant even when the reference clock varies. The frequency adjustment circuit changes a set value in a counter, which determines the PLL clock frequency, in accordance with the variation in the reference clock frequency.

15 Claims, 8 Drawing Sheets

PLL CONTROL CIRCUIT

TECHNICAL FIELD

The present invention relates to a PLL (Phase Locked Loop) control circuit for controlling PLL circuits, and in particular to a PLL control circuit for use in mobile wireless communication devices, such as portable terminals.

BACKGROUND ART

This type of PLL circuit (hereafter, referred to simply as the "PLL") is generally structured by a voltage-controlled oscillator (VCO), a phase comparator, and a loop filter. More specifically, the phase comparator detects phase difference between an input signal supplied from the outside thereof and an output signal output from the VCO and feeds back a voltage indicating the phase difference to the VCO through the loop filter. The PLL of this type can be controlled so that the VCO oscillation frequency matches the frequency and phase of the input signal.

A PLL is typically formed as a semiconductor integrated circuit and used in a variety of equipment. For example, PLLs applicable to portable terminals such as portable telephones are described in Japanese Laid-Open Patent Publication No. 2003-152535 (Patent Document 1) and Japanese Laid-Open Patent Publication No. 2003-133951 (Patent Document 2).

Patent Document 1 discloses a PLL employing a VCO operable in a plurality of frequency bands such as GSM (Global System for Mobile Communication), DCS (Digital Cellular System), and PCS (Personal Communication System). The disclosed PLL is effective in that the sensitivity of the VCO control voltage is not increased even if an oscillation frequency band is widened in the VCO and that the PLL is strong against external noise or variation in supply voltage.

Specifically, according to Patent Document 1, an oscillation frequency of the oscillating circuit in each frequency band is measured in a state in which the control voltage of the oscillating circuit forming the PLL is fixed at a predetermined voltage and the measured value is stored in a memory circuit. This measured and stored value of the frequency is compared with a set value which is given during operation of the PLL so as to designate a frequency band. On the basis of the comparison result, a frequency band actually used in the oscillating circuit is determined.

Accordingly, the PLL described in Patent Document 1 comprises, in addition to the memory circuit, a variable frequency divider connected to the VCO, a frequency counter for counting frequency based on both an output from a reference oscillator and an output from the VCO, and a phase comparator for comparing the phase between the VCO output and the reference oscillator output.

Patent Document 2 discloses a PLL which performs in response to a data signal, a clock signal, and a strobe (STB) sent from a CPU. According to the disclosure of Patent Document 2, a signal with a desired frequency can be generated by setting a desired count value in a programmable counter by the use of the data signal.

Patent Document 2 also proposes a PLL provided with a circuit which ignores noise so that malfunction is prevented even if the noise is superimposed on a strobe signal. Specifically, a strobe signal having a predetermined pulse width is generated by the CPU, and reference signals are counted during the pulse width interval of the strobe signal, whereby the strobe signal is discriminated from the noise to prevent malfunction due to noise.

At any rate, Patent Documents 1 and 2 disclose PLLs capable of varying frequency by using a frequency counter or a programmable counter.

However, neither Patent Document 1 nor 2 points out any problems unique to mobile wireless communication devices such as portable terminals have problems and appropriate countermeasures needed in PLLs used in such mobile wireless communication devices so as to solve the above-mentioned problems.

More specifically, it is a common practice in a mobile wireless communication device such as a portable terminal to set a power saving mode while the device is not in conversation mode or it is in standby mode so that the power consumption becomes less in comparison with when the device is in conversation mode. The term "power saving mode" as used herein is a mode which is temporarily executed in operation of mobile wireless communication devices such as portable terminals and is different from the mode which is used for setting.

Further, a portable telephone among portable terminals is individually provided with an integrated circuit portion including a CPU and a clock generator for generating a reference clock and another integrated circuit portion for receiving the reference clock as an input signal to drive a display device such as a liquid-crystal display (LCD). In this case, the integrated circuit portion for driving the display device may be provided with a PLL so that the PLL is operated according to the reference clock.

In the portable telephone having such configuration, it often happens that the reference clock frequency is remarkably reduced in the power saving mode in comparison with that in ordinary conversation mode, or the power supply to the circuit portion including the CPU is sometimes turned off to reduce the reference clock frequency to zero.

Consideration is also made about parallel/serial (P/S) converting an output signal of a PLL operated in response to a reference clock and supplying the converted signal to a display device. This structure makes it possible to reduce the number of wiring lines and to reduce the occurrence of noise among parallel wiring lines. When such a P/S converter is provided, the frequency of a PLL clock output by the PLL becomes much higher than the frequency of a reference clock. Moreover, when the reference clock frequency is reduced or stopped in the power saving mode, variation in the PLL clock frequency of the PLL will become severe.

Accordingly, in portable telephones having a P/S converter, the PLL clock will vary largely when the reference clock frequency is reduced or stopped in the power saving mode. Therefore, it has been found that conventional PLL control circuits provided with a PLL are not able to follow such variation in the PLL clock, resulting in occurrence of malfunction.

However, neither Patent Document 1 or 2 mentions about possible malfunction of the PLL in the power saving mode or about countermeasures to prevent the same.

DISCLOSURE OF THE INVENTION

In view of the problems described above, it is an object of the present invention to provide a PLL control circuit suitable for use in a mobile terminal such as a portable telephone having power saving mode.

It is another object of the present invention to provide a PLL control circuit which is capable of generating a substantially fixed PLL clock even if the reference clock frequency temporally varies considerably.

It is still another object of the present invention to provide a PLL control circuit which is capable of preventing malfunction of a display device such as an LCD and loss in sequence processing even if there is variation in the reference clock.

A first aspect of the present invention provides a PLL control circuit comprising a counter portion for changing and controlling an output frequency of a PLL; a detecting portion for detecting a reference clock input to the PLL; and a setting changing portion for changing a set value of the counter portion based on a detection result of the detecting portion.

A second aspect of the present invention provides a PLL control circuit comprising: a counter portion for changing and controlling an output frequency of a PLL; a detecting portion for detecting a reference clock input to the PLL; a counting portion for counting the reference clocks based on a detection result of the detecting portion; and a circuit for controlling stoppage of supply of the reference clocks and feedback clocks to the PLL.

In the PLL control circuit according to the first aspect, the change of frequency may be performed by sampling the reference clock obtained by multiplying the PLL frequency, or by sampling the reference clock with the use of a second clock.

A third aspect of the present invention provides a PLL control circuit which receives a reference clock having a variable frequency and outputs a PLL clock. The PLL control circuit comprises: means for measuring a frequency of the reference clock to detect change in the frequency of the reference clock; and a frequency adjustment portion for changing and controlling a circuit element having a parameter determining the PLL clock frequency according to the change in the frequency of the reference clock to control the frequency of the PLL clock to be substantially constant.

In this case, the means for detecting change in the frequency has a frequency measurement circuit which digitally measures and detects the frequency of the reference clock; and the frequency adjustment portion includes a setting circuit which updates the parameter of the circuit element based on the frequency values before and after the change of the reference clock frequency and sets the updated parameter in the circuit element.

On the other hand, the means for detecting change in the frequency may have a frequency determination circuit which determines stoppage of the reference clock; and the frequency adjustment portion may be formed by a clock stop control circuit which sets the PLL in a free running state during the stoppage of the reference clock.

The PLL control circuit according to the present invention is applicable to various electronic devices, for example, a portable terminal.

A fourth aspect of the present invention provides a PLL control method in which a PLL for generating a PLL clock is provided, and the PLL clock is controlled in accordance with a reference clock having a variable frequency. The control method includes the steps of: detecting change in the frequency of the reference clock; and, when the change in the frequency is detected, maintaining the PLL clock frequency to be substantially constant by changing a parameter determining the PLL clock according to the change in the frequency.

Effects of the Invention

The present invention offers a PLL control circuit which is able to prevent the loss of data and sequence processing even if the reference clock varies during operation of the PLL. The PLL control circuit according to the present invention thus has an advantage that there is no need of decreasing the processing capacity of the entire system even in the power saving mode. Further, the present invention dispenses with managing the state of each of LSIs forming the system, and thus provides an advantageous effect that the system designer is free from troublesome system management.

BEST MODE FOR CARRYING OUT THE INVENTION

Embodiments of the present invention will be described with reference to the drawings.

Figure 1:
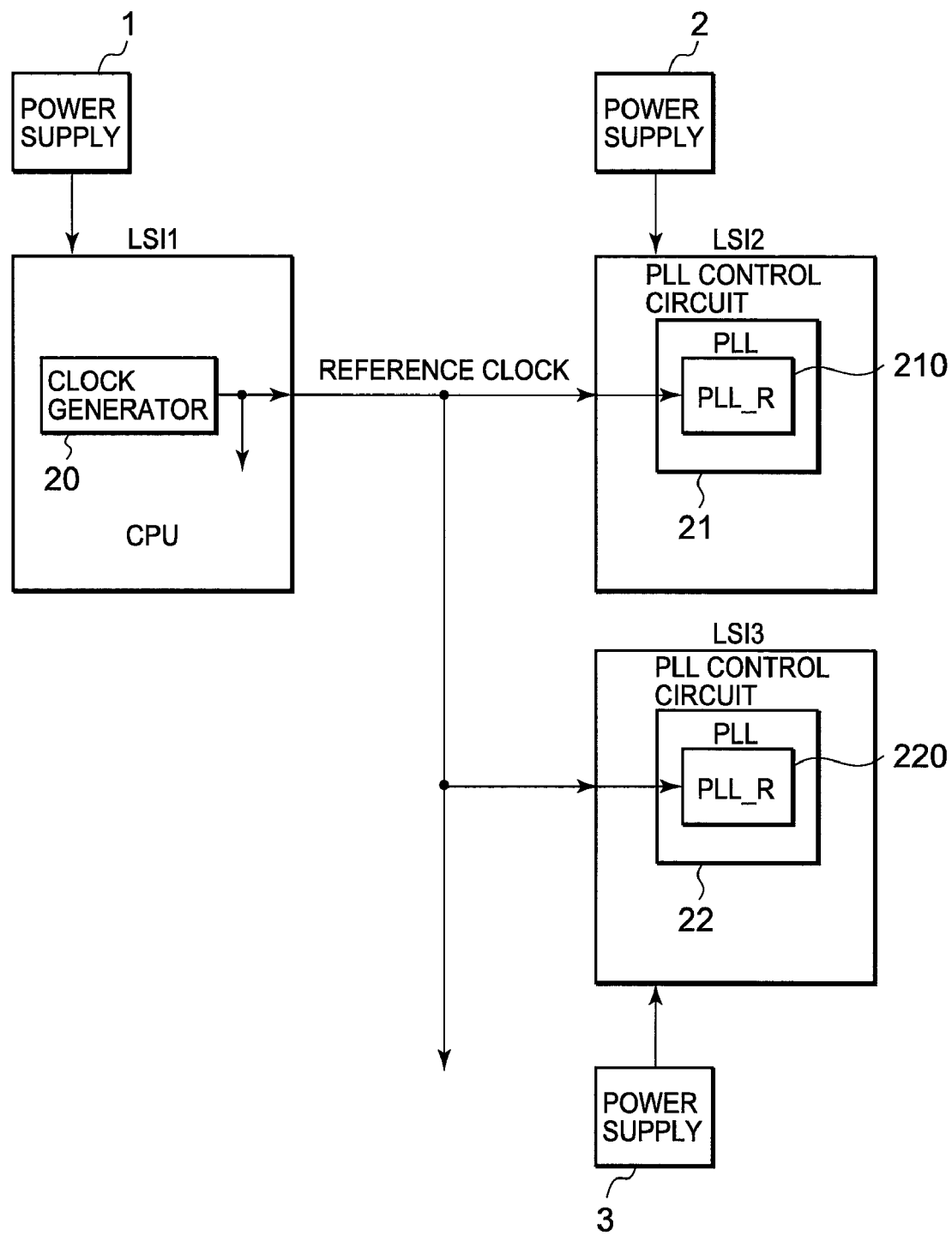
FIG. 1 is a block diagram showing an example of a system to which a PLL control circuit according to the present invention is applicable.

Referring to FIG. 1, there is shown typical configuration of a system to which the present invention is applicable. FIG. 1 show an example of a system having a clock generator 20 and distributing a reference clock from an integrated circuit portion LSI1 operating as a CPU to other integrated circuit portions, to two integrated circuit portions LSI2 and LSI3 here. The three integrated circuit portions LSI1, LSI2 and LSI3 illustrated here have separate power supplies 1, 2 and 3, respectively.

In this system, the two integrated circuit portions LSI2 and LSI3 have PLL control circuits 21 and 22 including PLLs 210 and 220, respectively. Each of the PLL control circuits 21 and 22 receives a reference clock from the clock generator 20 and drives an external device (a display device, for example) externally connected to the integrated circuit portion LSI2, LSI3 according to the PLL clock.

The integrated circuit portion LSI1 operating as the CPU may reduce the reference clock frequency or stop the reference clock in order to reduce the power consumption. The integrated circuit portions LSI2 and LSI3 receiving the reference clock may be required to perform normal processing operation even if there is variation in the reference clock frequency. In such a case, the timing to switch or stop the reference clock frequency must be determined in consideration of the state of data processing or sequence processing in the integrated circuit portions LSI2 and LSI3.

If the reference clock timing is erroneously determined here, the integrated circuit portions LSI2 and LSI3 will cause loss in the data or sequence processing, possibly resulting in malfunction thereof.

In this event, it happens that ability of a system processing would usually be reduced or the processing itself becomes impossible while the reference clock frequency is decreased or stopped for the power saving. If the reference clock, the PLL clock and so on are controlled in consideration of a whole system in order to alleviate the deterioration in the processing ability, it will make the system control complicated.

Figure 2:
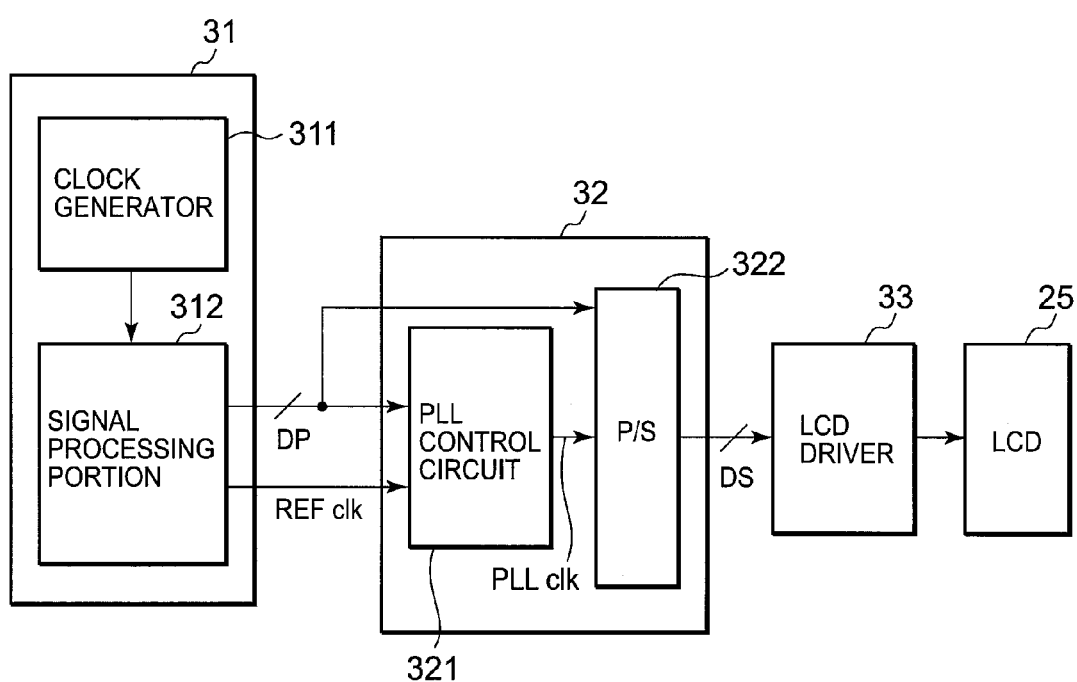
FIG. 2 is a block diagram showing a portable terminal including a PLL control circuit according to the present invention.

Referring to FIG. 2, there is shown, as a specific example of the system shown in FIG. 1, configuration of a system in which the present invention is applied to a portable terminal, particularly to a portable telephone. The system shown in FIG. 2 has a first integrated circuit portion 31 operating as a CPU, a second integrated circuit portion 32 (to be described later) including a PLL control circuit according to the present invention, and a third integrated circuit portion 33 for driving an LCD 25 as a display. Like those in FIG. 1, each of these circuit portions is formed by an LSI, and the third integrated circuit portion 33 operates as an LCD driver.

The first integrated circuit portion 31 shown in FIG. 2 is featured by a clock generator 311 generating a system clock and a signal processing portion 312 which receives a system clock and generates a reference clock while outputting a data signal. The signal processing portion 312 generates, from a system clock, a reference clock REFclk distributed to the second integrated circuit portion 32 while outputting a parallel data signal DP in bit parallel (in 18-bit parallel, for example) format. The CPU used herein for the portable telephone generates a reference clock REFclk for example with a frequency of 6 Mz in the normal mode, whereas in the power saving mode, reduces the frequency of the reference clock REFclk to a low frequency (e.g. 1.5 MHz), or stops the reference clock REFclk.

The second integrated circuit portion 32 forms a PLL unit including a PLL control circuit 321 and a parallel (P)/serial (S) conversion circuit 322. The PLL unit is connected to an LCD driver 323 through flexible wiring lines. Although description will be made here on the assumption that the PLL unit composed on the PLL control circuit 321 and the P/S conversion circuit 322 is formed as an independent integrated circuit, the PLL unit may be incorporated in the first integrated circuit portion 31.

The PLL control circuit 321 transmits to the P/S conversion circuit 322 a PLL clock PLLclk having a frequency (e.g. 114 MHz) higher than that of the reference clock REFclk in order to output from the P/S conversion circuit 322 a data signal in bit serial format (i.e., a serial data signal DS). The P/S conversion circuit 322 outputs a serially converted serial data signal to the LCD driver 323 through flexible wiring lines. The flexible wiring lines for transmitting the serial data signal DS can be formed by a smaller number of lines (for example, about six lines) than parallel wiring lines, and are capable reducing the noise inherent to flexible wiring.

Receiving the serial data signal DS, the LCD driver 323 drives the LCD 25 according to the PLLclk to display the data signal. According to this configuration, the number of flexible wiring lines required for folding the LCD display 25 is reduced, whereby failures due to wiring disconnection can be reduced and the noise also can be reduced.

Figure 3:
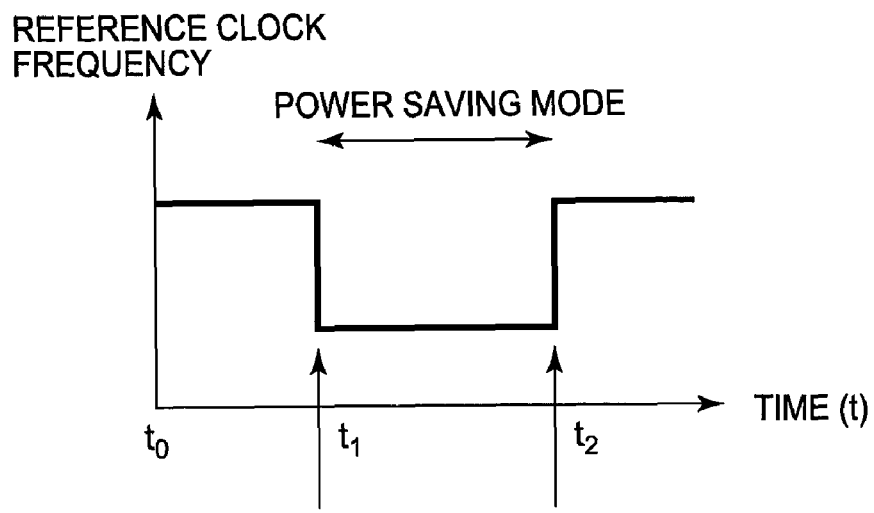
FIG. 3 is a diagram for explaining an example of a mode in which reference clock frequency varies in a portable terminal.

Next, referring to FIG. 3, description will be made on variation in frequency of the reference clock output by the signal processing portion 312 of the portable telephone shown in FIG. 2. In FIG. 3, time (t) is plotted on the horizontal axis and reference clock frequency is plotted on the vertical axis. FIG. 3 shows an example in which the reference clock frequency is maintained at a high level (e.g. 6 MHz) during the interval from t0 to t1, and the reference clock frequency drops to a low level of about 1.5 MHz, for example, when the power saving mode is designated in the interval from t1 to t2.

Figure 4:
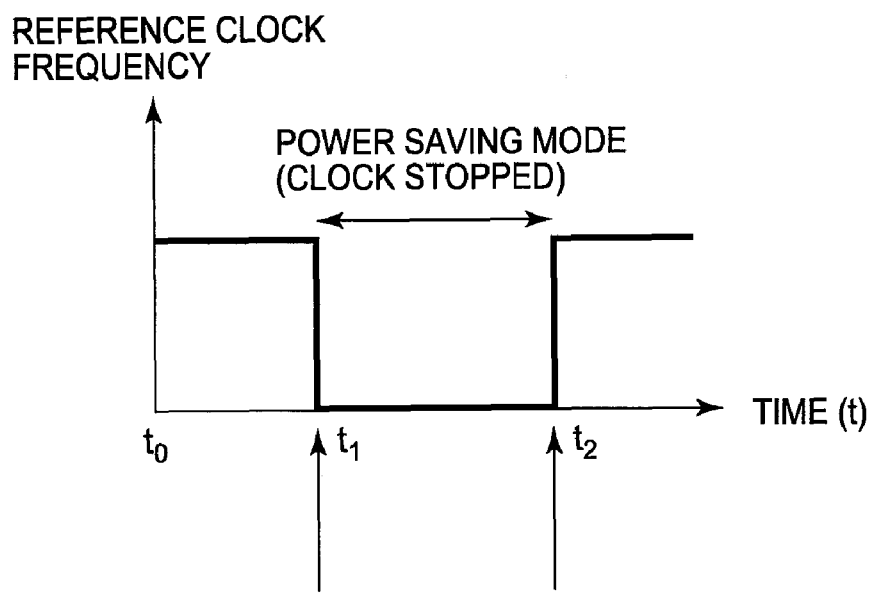
FIG. 4 is a diagram for explaining another example of a mode in which reference clock frequency varies in a portable terminal.

On the other hand, FIG. 4 shows an example in which the reference clock is stopped during the interval from t1 to t2 in the power saving mode.

Returning to FIG. 2, when the reference clock REFclk varies in the power saving mode as shown in FIG. 3 or FIG. 4, the variation in the PLL clock PLLclk having a much higher frequency than the reference clock REFclk varies more severely than the variation in the reference clock REFclk. Therefore, if normal PLL control is performed, the PLL clock PLLclk will not be able to follow the variation in the reference clock REFclk, possibly resulting in occurrence of malfunction.

In consideration of the problems described above, the system shown in FIG. 2 is provided with the PLL control circuit 321 which is capable of dealing with large variation in the reference clock REFclk and even larger variation in the PLL clock PLLclk, and capable of preventing malfunction or the like.

Figure 5:
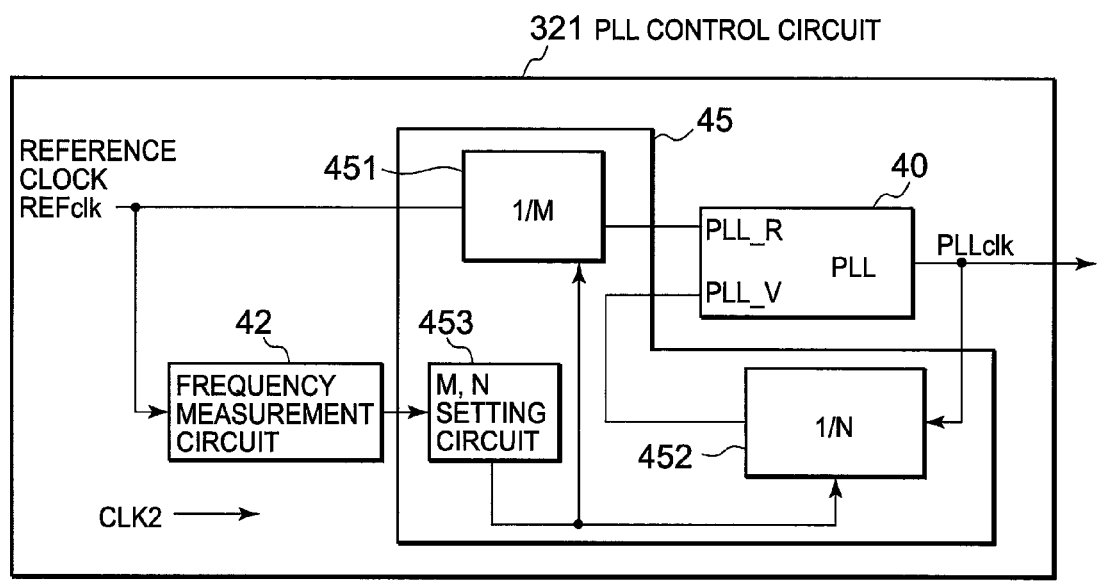
FIG. 5 is a block diagram showing a PLL control circuit according to an embodiment of the present invention.

Referring to FIG. 5, description will be made on specific configuration of the PLL control circuit 321 according to the present invention. The PLL control circuit 321 shown in FIG. 5 operates by receiving a reference clock REFclk the frequency of which temporarily varies in a great extent in the power saving mode, as well as a second clock clk2 having a frequency higher than that of the reference clock REFclk.

The PLL control circuit 321 has a PLL 40, a frequency measurement circuit 42 for measuring frequency of the reference clock REFclk, and a frequency adjustment circuit 45 which keeps the frequency of the PLL clock PLLclk of the PLL 40 at a substantially fixed level according to the reference clock REFclk and the detection result of the frequency measurement circuit 42. Specifically, the frequency adjustment circuit 45 shown in FIG. 5 operates such that the frequency of the PLL clock PLLclk can be kept at a substantially fixed level, even if the reference clock frequency is reduced in the power saving mode as shown in FIG. 3.

For this purpose, the frequency adjustment circuit 45 has a 1/M counter 451 for counting reference clocks REFclk, a 1/N counter 452 for counting PLL clocks PLLclk, and an M, N setting circuit 453 connected to the frequency measurement circuit 42. Each of the 1/M counter 451 and the 1/N counter 452 is a variable counter the count number of which can be changed as required (or a variable frequency divider). A desired multiplication of frequency can be obtained by setting the count values of these counters. These counters operate as circuit elements which can change the parameters. M and N are positive integers.

Figure 6:
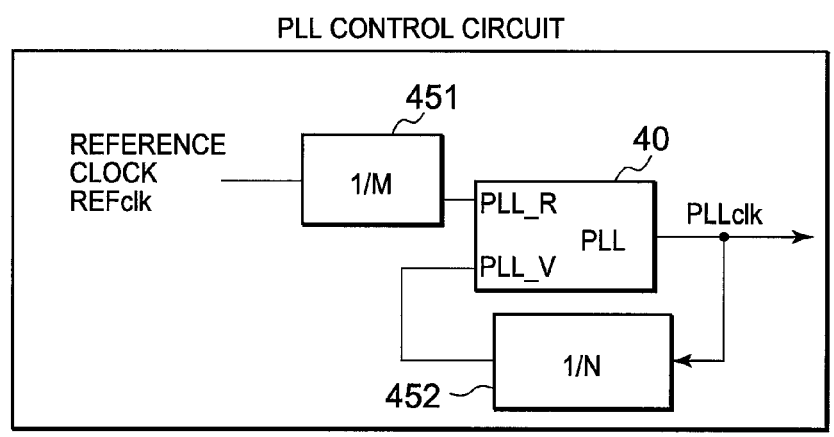
FIG. 6 is a block diagram showing a PLL control circuit corresponding to the PLL control circuit of the present invention shown in FIG. 5 a part of which has been removed.

In order to facilitate an understanding of operation of the PLL control circuit 321 shown in FIG. 5, description will firstly be made of operation of a PLL control circuit on the assumption that there is no frequency measurement circuit 42 and M, N setting circuit 453, but a 1/M counter 451 and a 1/N counter 452 are each formed by a fixed counter. In this case, the PLL control circuit has configuration as shown in FIG. 6. In the PLL control circuit shown in FIG. 6, a reference clock REFclk is fed to the 1/M counter 45, and supplied to a PLL_R terminal of the PLL 40 via the 1/M counter 451. On the other hand, a PLL clock PLLclk is output to an external circuit while being fed back to a PLL_V terminal of the PLL 40 via the 1/N counter 452.

In the PLL control circuit shown in FIG. 6, when frequency of PLLclk of the PLL 40 is denoted by fPclk, and frequency of the reference clock REFclk is denoted by fRclk, the PLL clock frequency (fPclk) as a multiplication clock of the reference clock frequency (fRclk) can be computed as follows.

$$fPclk=(1/M)\cdot N\cdot(fRclk) \quad (1)$$

In this case, in the preceding signal processing portion 31, the frequency may be reduced as in the power saving mode or may be increased when returning from the power saving mode.

When fRclk varies in this manner, the PLL clock frequency (fPclk) is varied so far as the values of M and N are fixed, as seen from the expression (1). Moreover, the PLL 40, which locks up according a new reference clock frequency, becomes unable to satisfy the expression (1) since fPclk also becomes unstable in the interval in which fRclk varies. As a result, the logic circuit operating with the PLL clock PLLclk will not only lose its processing data but also becomes unable to execute the processing sequence.

In consideration of this, the PLL control circuit 321 according to the present invention has configuration, as shown in FIG. 5, in which a frequency measurement circuit 42 is provided, and an M, N setting circuit 453 is provided in a frequency adjustment circuit 45, so that the values of M and N in the 1/M counter 451 and the 1/N counter 452 are varied and controlled by the M, N setting circuit 453.

Additionally referring to the state diagram of FIG. 7, description will be made on operation of the PLL control circuit 321 shown in FIG. 5.

Figure 7:
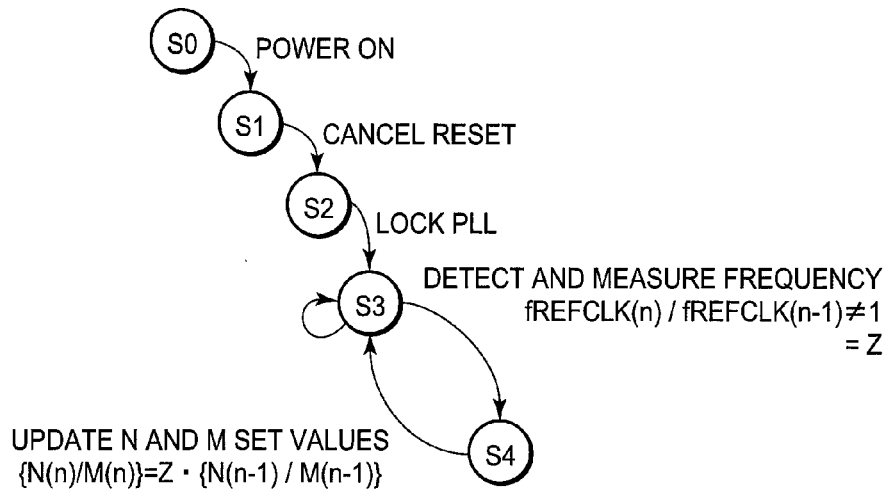
FIG. 7 is a state transition diagram for explaining operation of the PLL control circuit shown in FIG. 5.

As shown in FIG. 7, when power supply is turned ON in a power supply OFF state (S0), the state shifts to a state (S1). When RSEET is canceled in the state (S1), the state shifts to a state (S2), after which the PLL 40 shown in FIG. 5 is set in a locked state (PLL locked state) (S3). In the state (S3), the frequency measurement circuit 42 shown in FIG. 5 constantly monitors the frequency.

When the frequency fRclk of the reference clock REFclk varies in the frequency measurement circuit 42, the PLL control circuit 321 shifts from the state (S3) to a state (S4) as shown in FIG. 7. In the state (S4), the count values of the 1/M counter 451 and 1/N counter 452 are computed by the M, N setting circuit 453. Specifically, in the state (S4), the count values of the 1/M counter 451 and 1/N counter 452 are computed by the M, N setting circuit 453 such that the frequency fPclk(n−1) of the PLL clock PLLclk before switching is equal to the frequency fPclk(n) after switching.

Upon completion of the computation, the computation result is set in the 1/M counter 451 and the 1/N counter 452 in the state (S4). The PLL control circuit 321 then shifts to the state (S3) to output a PLL clock PLLclk according the newly set count values. Thus, it can be seen that the PLL control circuit 321 shown in the drawing controls such that the frequency of the PLL clock PLLclk is always constant by changing the count values in the 1/M counter 451 and the 1/N counter 452 provided in the PLL control circuit 321 in accordance with the variation in the reference clock REFclk.

Figure 8:
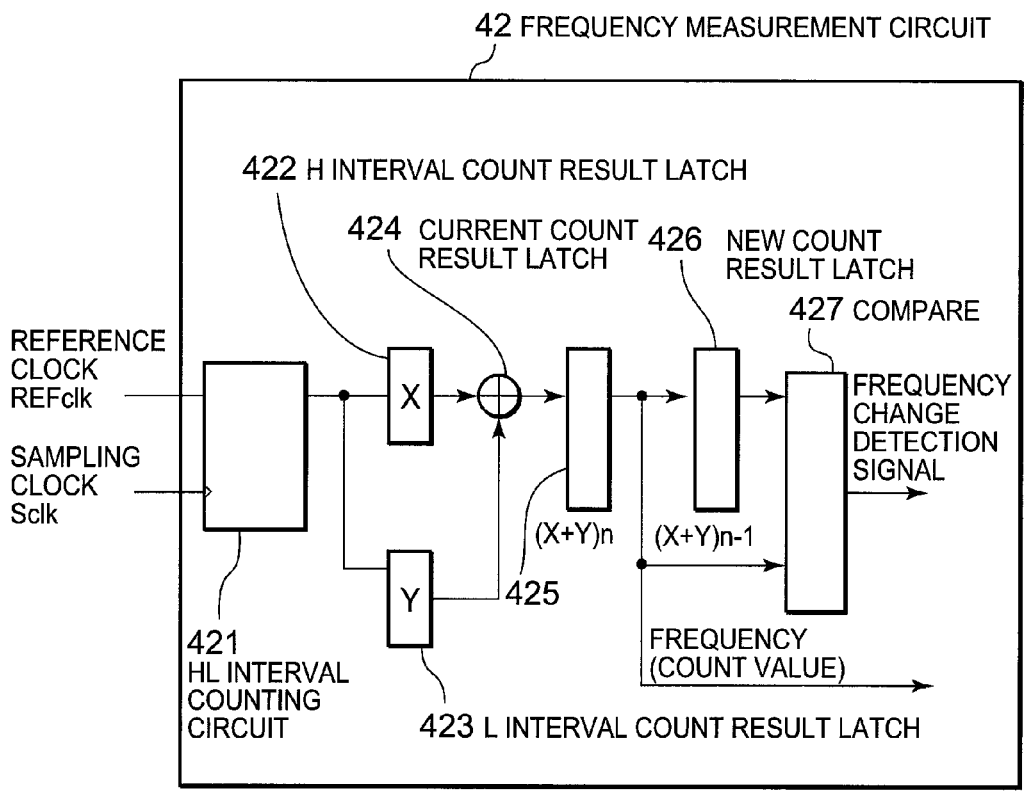
FIG. 8 is a block diagram showing a frequency measurement circuit used in the PLL control circuit shown in FIG. 5.

Referring to FIG. 8, a specific example of the frequency measurement circuit 42 shown in FIG. 5 will be described. The frequency measurement circuit 42 shown here is supplied with a reference clock REFclk and a sampling clock Sclk having a frequency higher than that of the reference clock REFclk. The frequency measurement circuit 42 detects and measures the frequency of the reference clock REFclk by counting the number of sampling clocks Sclk in the intervals in which the reference clock REFclk is at a high level (H) and at a low level (L).

Describing more specifically, the frequency measurement circuit 42 has an HL interval counting circuit 421 for counting high level (H) and low level (L) intervals, a first latch circuit 422 for latching a count result (X) of the H intervals, a second latch circuit 423 for latching a count result (Y) of the L intervals, and an adding circuit 424 for adding the latch results (X+Y) of the first and second latch circuits 422 and 423. Further, the frequency measurement circuit 42 has a third latch circuit 425 for latching a latch result (X+Y)n at present time (n), a fourth latch circuit 426 for latching a latch result (X+Y)n−1 at previous time (n−1), and a comparator circuit 427 for comparing the latch results (X+Y)n and (X+Y)n−1 of the third and fourth latch circuits 425 and 426.

The comparator circuit 427 compares the latch results (X+Y)n and (X+Y)n−1. If neither of the values is one, in other words, when the reference clock at the present time n is different from the reference clock at the previous time n−1, the comparator circuit 427 outputs a frequency change detection signal indicating that the reference clock frequency has been changed, and the count value of the third latch circuit 425 at the present time n, that is, the frequency after the variation.

Figure 9:
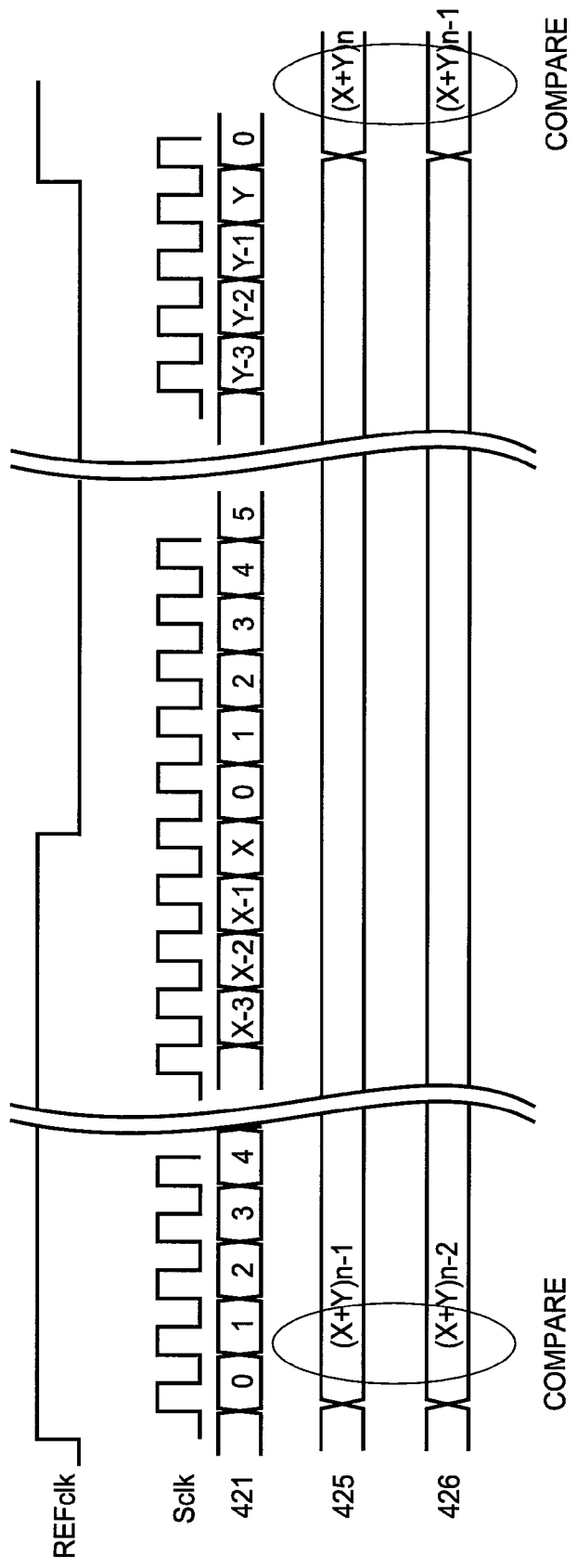
FIG. 9 is a timing chart for explaining operation of the frequency measurement circuit shown in FIG. 8.

Referring additionally to FIG. 9, the frequency measurement circuit 42 shown in FIG. 8 counts the reference clocks REFclk with sampling clocks Sclk, and measures the same by means of count quantity in the interval in which the high level H or the low level L does not vary. This means that a multiplication clock of the PLL clock Pclk or an arbitrary clock existing in the LSI (for example, a second clock CLK2) is used as the sampling clock Sclk.

As shown in FIG. 9, the HL interval counter 421 counts the sampling clocks Sclk in the high level H interval or the low level L interval. The result of addition of the count values X and Y is latched by the third latch circuit 425 as the count value (X+Y)n at the present time n, while the count value (X+Y)n−1 at the previous time is latched by the latch circuit 426. These count values are count values per reference clock, and thus can be viewed as frequencies per unit of the sampling clock Sclk. Accordingly, these count values can be treated as frequencies.

Returning to FIG. 5, the M, N setting circuit provided in the frequency adjustment circuit 45 obtains a variation amount Z of the reference clock frequency fRclk based on the count values after variation (that is, the count values at the present time). Further, the multiplication ratios of the 1/M counter 451 and the 1/N counter 452 are changed such that the PLL clock frequency fRclk becomes constant with respect to the variation amount Z obtained.

Specifically, in the state (S4) in FIG. 7, the M, N setting circuit 453 sets the M and N values in the 1/M count circuit 451 and the 1/N count circuit 452 such that the following expression is established.

$$\{N(n)/M(n)\}=Z\cdot\{N(n-1)/M(n-1)\} \quad (2)$$

Thus, the M, N setting circuit 453 sets the M and N values in the 1/M count circuit 451 and the 1/N count circuit 452 to satisfy the expression (2), whereby a PLL clock with a constant frequency can be supplied to an external circuit. This eliminates the possibility of loss of data or stoppage of data processing.

If it is assumed that the value of M is fixed to one (that is, the 1/M counter 451 is not involved) when the frequency of the reference clock REFclk varies from 6 MHz to 1.5 MHz in the power saving mode, the condition of the expression (2) can be satisfied by changing the value of N from 19 to 76.

This circuit configuration offers the same effect when the frequency is increased as when the frequency is reduced in the power saving mode. Further, the present is not limited to the PLL control circuit 321 shown in FIG. 5, but is also applicable to PLL control circuits having other configuration.

Figure 10:
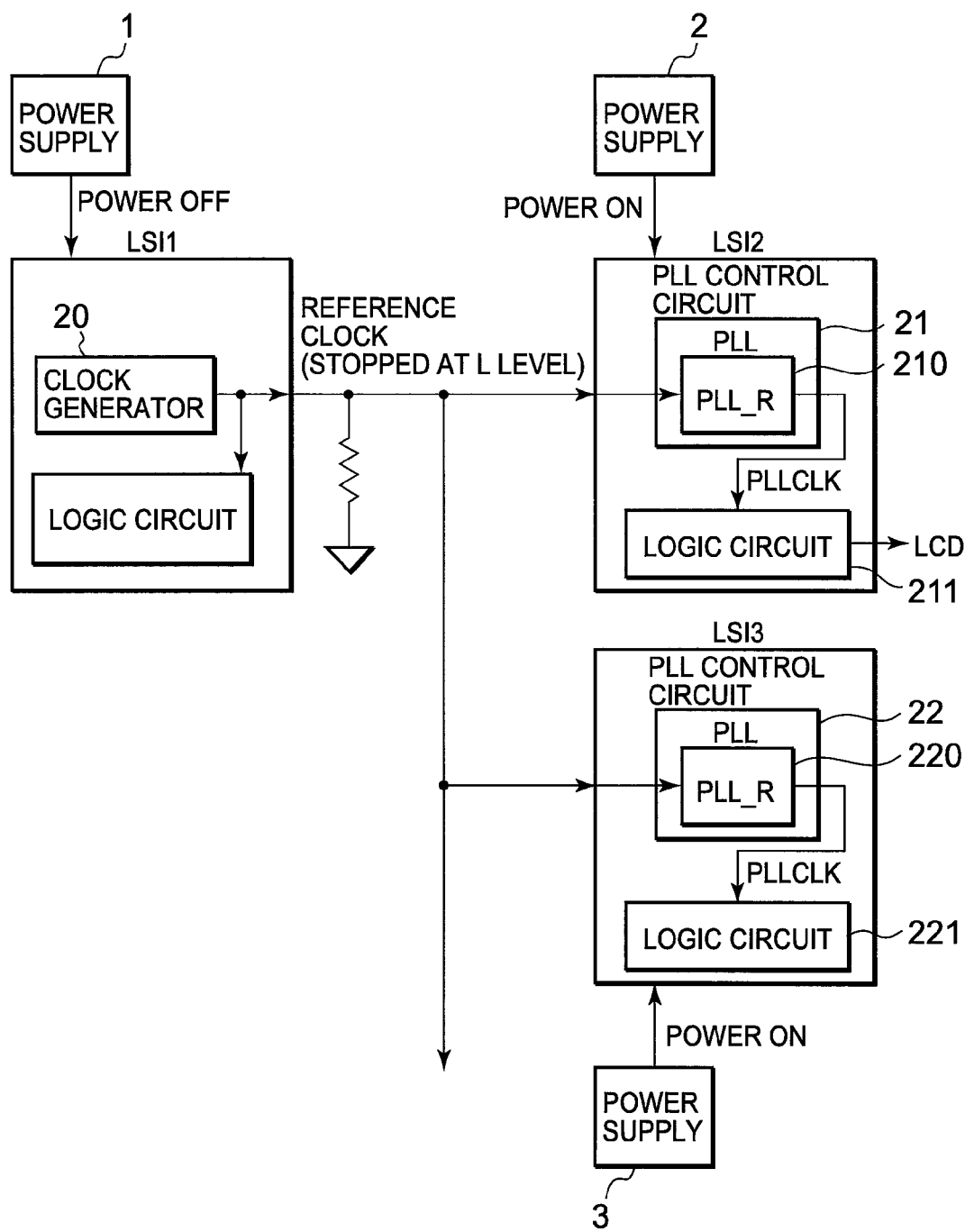
FIG. 10 is a block diagram showing another system to which a PLL control circuit according to the present invention is applicable.

Referring to FIG. 10, another type of system to which the present invention is applicable will be described. The system shown in FIG. 10 is designed to stop the reference clock during the power saving mode, instead of reducing the reference clock frequency as shown in FIG. 3. Description here will be made of a case in which, as shown in FIG. 10, the power supply to a clock supplying source LSI 1 is turned OFF while the power supply to other LSIs 2 and 3 is kept ON. In the example shown in FIG. 10, a pulldown element is inserted into a wiring portion of the reference clock REFclk of the LSI 1. Therefore, it is assumed that the reference clock REFclk is fixed to "L" level when the LSI 1 power supply is OFF, whereas it is fixed to the "H" level when the clock is pulled up.

In FIG. 10, the reference clock is stopped when the power supply to the LSI 1 is OFF. Therefore, the reference clock supply to terminals PLL_R of PLLs 210 and 220 of the other LSIs 2 and 3. However, terminals PLL_V (feedback clock) of the PLL 210 and 220 are supplied with a clock obtained by dividing the PLLclk from respective VCO oscillating circuits in the PLLs 210 and 220 by 1/N. In this case, the PLLs 210 and 220 assume a free-running state to match the phase of the PLL_V to the phase of the PLL_R, whereby the frequency of the PLL clock PLLclk is reduced gradually. However, the PLL clock frequency may be treated as substantially constant at least for a limited duration of time such as during the power saving mode.

In FIG. 10, when the reference clock REFclk is stopped, the PLLs 210 and 220 of the LSIs 2 and 3 assume a free-running state and output a PLLclk to logic circuits 211 and 221 connected to the PLLs 210 and 220, respectively. Since the PLL clock frequency is substantially constant when the reference clock is stopped, as described above, no malfunction will occur in the logic circuits 211 and 221 operating according to these PLL clocks.

Figure 11:
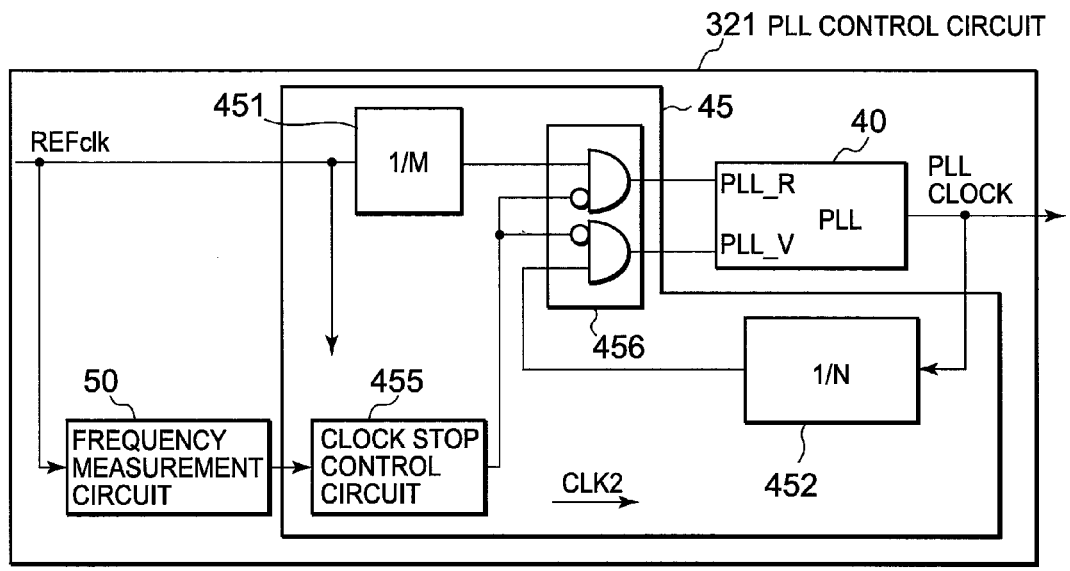
FIG. 11 is a block diagram showing a PLL control circuit according to another embodiment of the present invention.

Referring to FIG. 11, there is shown a PLL control circuit 321 usable in the system shown in FIG. 10. The PLL control circuit 321 shown in FIG. 11 has a frequency determination circuit 50 which outputs a clock stop signal when detecting the stoppage of the reference clock REFclk. A frequency adjustment circuit 45 for adjusting the PLLclk of the PLL 40 upon receiving the clock stop signal has a 1/M counter 451 and a 1/N counter 452, and additionally a clock stop control circuit 455 and a logic circuit 456. The clock stop control circuit 455 outputs a logic "1" to the logic circuit 456 when receiving a clock stop signal from the frequency determination circuit 50, whereas outputs a logic "0" to the logic circuit 456 when receiving no clock stop signal.

The logic circuit 456 supplies the output of the 1/M counter 451 and the 1/N counter 452 directly to the PLL_R and PLL_V terminals of the PLL 40 when the logic circuit 456 is supplied with the logic "0". Therefore, in a normal mode, the PLL 40 outputs a PLLclk having a frequency defined by count values of the counters 451 and 452. However, when the stoppage of the reference clock REFclk is detected by the frequency determination circuit 50, and the logic "1" is supplied to the logic circuit 456 from the clock stop control circuit 455, the PLL 40 assumes a free running state and outputs a PLLclk with a frequency substantially equivalent to that of the reference clock REFclk before the stoppage.

In other words, the PLL control circuit 321 shown in FIG. 11 is characterized in that even when the reference clock is stopped, the PLL control circuit 321 is able to supply the PLL clock while maintaining the PLL clock frequency in the lockup state before the stoppage.

Figure 12:
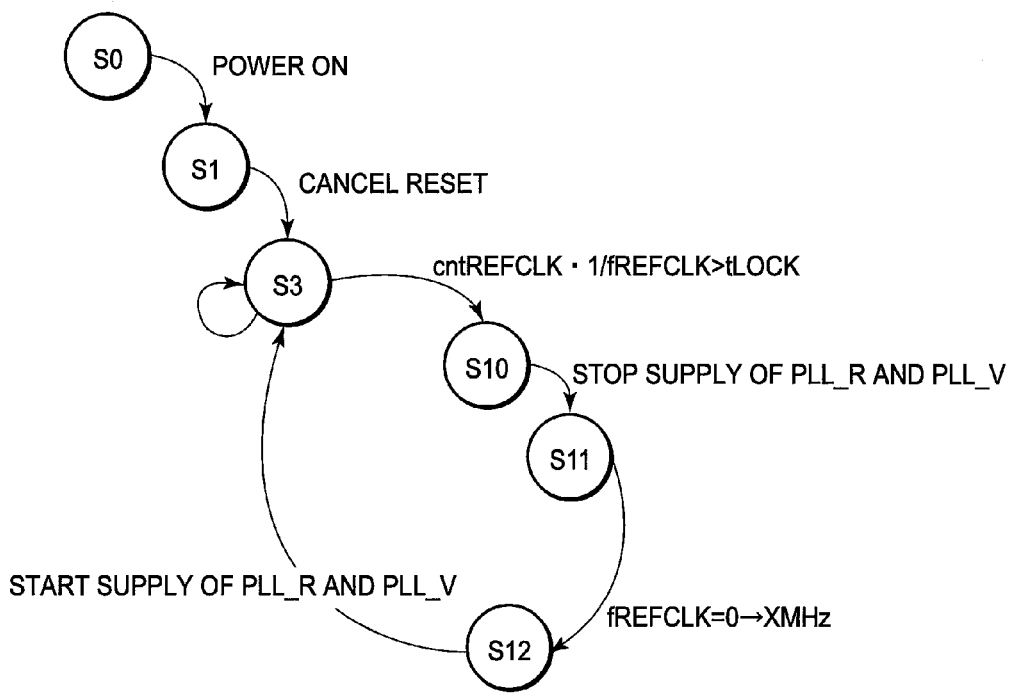
FIG. 12 is a state transition diagram for explaining operation of the PLL control circuit shown in FIG. 11.

Referring additionally to FIG. 12, control operation of the PLL control circuit 321 shown in FIG. 11 will be described. In a circuit including a PLL, in general, the time required for the circuit shifting from the initial state in which power supply is turned ON or the circuit is reset to the locked state in which the PLL clock frequency is stabilized (that is, the lockup time) is a value specific to the PLL or a filter associated thereto. Accordingly, in order to detect stoppage of the reference clock, it is necessary to discriminate the lockup time from the stop time of the reference clock in the power saving mode. The lockup time is a specific value as described above, whereas the stop time of the reference clock in the power saving mode is usually longer than the lockup time.

The frequency determination circuit 50 of the PLL control circuit 321 shown in FIG. 11 not only detects stoppage of the reference clock REFclk but also has a counter for counting reference clocks REFclk and a frequency measurement circuit having same configuration as that of the frequency measurement circuit shown in FIG. 8.

Describing more specifically, the frequency determination circuit 50 measures time based on frequency (fREFclk) from the frequency measurement circuit and a count value (cntREFclk) obtained from the counter, and compares the measured time with the lockup time tLOCK, whereby the lockup time tLOCK and the power saving mode time can be discriminated from each other. The lockup time tLOCK, the frequency (fREFclk), and the count value (cntREFclk) may satisfy the following relational expression (3). Further, the clock used for measuring the time is not limited to the reference clock REFclk but any other clock (second clock CLK2) existing in the LSI may be used.

$$tLOCK < cntREFclk \cdot (1/fREFclk) \quad (3)$$

A count value Z satisfying the expression (3) is predetermined, so that the frequency determination circuit 50 determines to be the power saving mode longer than the lockup time tLOCK when the counted value exceeds the predetermined count value Z.

Referring to FIG. 12 while taking into consideration the matters described above, the frequency determination circuit 50 monitors the elapse of lockup time tLOCK in the state (S3) according to the expression (3). When the counter has counted up to the set value Z and the condition of the expression (3) is satisfied, the state proceeds to the state (S10) in which the clock stop control circuit 455 stops PLL_R and PLL_V at the same time (S11). As described above, when the supply of the PLL_R and PLL_V is stopped simultaneously, the PLL 40 continues to supply the PLL clock at a frequency in the locked state, trying to keep the previous state. Thus, even if the reference clock is stopped, the PLL clock frequency will not be reduced and the frequency when locked can be maintained.

The frequency determination circuit 50 detects return from the reference clock stop state when the frequency of the reference clock REFclk varies from zero to a high frequency (S12), and starts supply of the PLL_R and PLL_V. The clock stop control circuit 455 then outputs a logic "0".

After this, the output of the 1/M counter 451 and 1/N counter 452 is supplied to the PLL_R and PLL_V of the PLL 40 (S3).

INDUSTRIAL APPLICABILITY

The present invention is also applicable to a portable terminal or the like having no P/S converter. Further, the present invention is applicable not only to a mobile wireless communication device such as a portable terminal but also other equipment for which power saving is required. Further, the number of variable counters or variable frequency dividers as circuit elements having a parameter to determine the PLL clock frequency may be one, or two or more.

The invention claimed is:

1. A PLL control circuit comprising:
a counter portion for changing and controlling an output frequency of a PLL;
a detecting portion for detecting a reference clock input to the PLL; and
a setting changing portion for changing a set value of the counter portion based on a detection result of the detecting portion.

2. A PLL control circuit comprising:
a counter portion for changing and controlling an output frequency of a PLL;
a detecting portion for detecting a reference clock input to the PLL;
a counting portion for counting reference clocks based on a detection result of the detecting portion; and
a circuit for controlling stoppage of supply of reference clocks and feedback clocks to the PLL.

3. The PLL control circuit according to claim 1 wherein the change of frequency is enabled by sampling the reference clock with the use of a clock obtained after PLL multiplication.

4. The PLL control circuit according to claim 1 wherein the change of frequency is enabled by sampling the reference clock with the use of a second clock.

5. The PLL control circuit according to claim 2 wherein measurement of time is enabled by counting the reference clocks.

6. The PLL control circuit according to claim 2 wherein measurement of time is enabled by counting second clocks.

7. A PLL control circuit which receives a reference clock having a variable frequency and outputs a PLL clock, the PLL control circuit comprising:
means for measuring frequency of the reference clock to detect change in the frequency of the reference clock; and
a frequency adjustment portion for changing and controlling a circuit element having a parameter determining the PLL clock frequency according to the change in the frequency of the reference clock to control the frequency of the PLL clock to be substantially constant.

8. The PLL control circuit according to claim 7, wherein:
the means for detecting change in the frequency has a frequency measurement circuit which digitally measures and detects the frequency of the reference clock; and
the frequency adjustment portion includes a setting circuit which updates the parameter of the circuit element based on the frequency values before and after the change of the reference clock frequency and sets the updated parameter in the circuit element.

9. The PLL control circuit according to claim 7 wherein:
the means for detecting change in the frequency has a frequency determination circuit which determines stoppage of the reference clock; and
the frequency adjustment portion has a clock stop control circuit which sets the PLL in a free running state during the stoppage of the reference clock.

10. The PLL control circuit according to claim 7, wherein the circuit element is at least one variable counter capable of varying the frequency dividing ratio.

11. The PLL control circuit according to claim 7, wherein the circuit element comprises a first variable counter for receiving and dividing the reference clock, and a second variable counter for receiving and dividing the PLL clock.

12. An electronic device comprising a PLL control circuit according to any one of claims 1 to 11.

13. A portable terminal comprising a PLL control circuit according to any one of claims 1 to 11.

14. A PLL control method in which a PLL for generating a PLL clock is provided, and the PLL clock is controlled in accordance with a reference clock having a variable frequency, the control method comprising the steps of:
detecting change in the frequency of the reference clock; and
when the change in the frequency is detected, maintaining the PLL clock frequency to be substantially constant by changing a parameter determining the PLL clock according to the change in the frequency.

15. The PLL control circuit according to claim 2, wherein the circuit for controlling stoppage of supply of reference clocks and feedback clocks to the PLL controls stoppage of the supply of the reference clocks and the feedback clocks so as to put the PLL into a free-running state when the reference clocks are stopped.

* * * * *